United States Patent
Brunschwiler et al.

(10) Patent No.: US 10,091,909 B2
(45) Date of Patent: Oct. 2, 2018

(54) METHOD AND DEVICE FOR COOLING A HEAT GENERATING COMPONENT

(71) Applicant: GLOBALFOUNDRIES INC., Grand Cayman (KY)

(72) Inventors: Thomas J. Brunschwiler, Thalwil (CH); Urs Kloter, Dietikon (CH); Ryan Joseph Linderman, Pasadena, CA (US); Bruno Michel, Zurich (CH); Hugo E. Rothuizen, Adliswil (CH); Reio Waelchli, Zurich (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 681 days.

(21) Appl. No.: 14/632,180

(22) Filed: Feb. 26, 2015

(65) Prior Publication Data
US 2015/0195955 A1    Jul. 9, 2015

Related U.S. Application Data

(62) Division of application No. 12/676,398, filed as application No. PCT/IB2008/053547 on Sep. 2, 2008.

(30) Foreign Application Priority Data

Sep. 7, 2007  (EP) ..................................... 07115962

(51) Int. Cl.
*H05K 7/20* (2006.01)
*H01L 23/427* (2006.01)
(Continued)

(52) U.S. Cl.
CPC ....... *H05K 7/20281* (2013.01); *F28D 1/0417* (2013.01); *G06F 1/20* (2013.01);
(Continued)

(58) Field of Classification Search
CPC .......... H05K 7/20281; H05K 7/20254; H05K 7/20272; F28D 1/0417; G06F 1/20;
(Continued)

(56) References Cited

U.S. PATENT DOCUMENTS 4,047,561 A * 9/1977 Jaster ................... H01L 23/473
165/104.32
5,694,295 A    12/1997 Mochizuki
(Continued)

FOREIGN PATENT DOCUMENTS

DE    10319367 A1    11/2004
JP    2001339026    12/2001
(Continued)

*Primary Examiner* — Orlando E Aviles Bosques
*Assistant Examiner* — Joel Attey
(74) *Attorney, Agent, or Firm* — Michael LeStrange; Hoffman Warnick LLC

(57) ABSTRACT

The invention relates to a cooling arrangement comprising a heat spreader (2) comprising a first surface (5), a second surface (8), at least one heat absorption chamber (9) and at least one heat dissipation chamber (10), the at least one heat absorption chamber (9) being in thermal contact with the first surface (5) and the at least one heat dissipation chamber (10) being in thermal contact with the second surface (8) and hydraulically coupled to the at least one heat absorption chamber (9). A cooling fluid (13) can be driven from the heat absorption chamber (9) to the heat dissipation chamber (10) using a plurality of flow patterns for cooling the first surface (5).

12 Claims, 7 Drawing Sheets

(51) Int. Cl.
*H01L 23/473* (2006.01)
*H01L 23/34* (2006.01)
*F28D 1/04* (2006.01)
*G06F 1/20* (2006.01)

(52) U.S. Cl.
CPC ............ *H01L 23/34* (2013.01); *H01L 23/427* (2013.01); *H01L 23/473* (2013.01); *H05K 7/20254* (2013.01); *H05K 7/20272* (2013.01); *G06F 1/203* (2013.01); *G06F 1/206* (2013.01); *H01L 2924/0002* (2013.01)

(58) Field of Classification Search
CPC ....... G06F 1/203; G06F 1/206; H01L 23/427; H01L 23/473
USPC ..... 165/80.3, 80.4, 109.1, 104.33, 287, 288, 165/908
See application file for complete search history.

(56) References Cited

U.S. PATENT DOCUMENTS

| | | | |
|---|---|---|---|
| 6,626,233 | B1 | 9/2003 | Connors |
| 6,670,699 | B2 | 12/2003 | Mikubo |
| 6,672,370 | B2 | 1/2004 | Searls |
| 6,889,756 | B1 | 5/2005 | Hou |
| 7,055,341 | B2 | 6/2006 | Nori et al. |
| 7,169,650 | B2 | 1/2007 | Rinella |
| 7,246,655 | B2 | 7/2007 | Mochizuki |
| 7,310,231 | B2 | 12/2007 | Ouyang |
| 7,483,770 | B2 | 1/2009 | Meinders et al. |
| 7,770,630 | B2 | 8/2010 | Chesser |
| 8,051,905 | B2 | 11/2011 | Arik et al. |
| 2002/0062648 | A1 | 5/2002 | Ghoshal |
| 2003/0043531 | A1* | 3/2003 | Trautman ................ F28F 13/02 361/274.3 |
| 2004/0182088 | A1 | 9/2004 | Ghoshal et al. |
| 2006/0098411 | A1 | 5/2006 | Lee |
| 2007/0017659 | A1* | 1/2007 | Brunschwiler ....... H01L 23/427 165/80.4 |
| 2007/0139885 | A1* | 6/2007 | Ouyang .................. G06F 1/189 361/699 |
| 2007/0139889 | A1 | 6/2007 | Ouyang et al. |
| 2007/0235180 | A1* | 10/2007 | Ouyang ................ H01L 23/473 165/287 |

FOREIGN PATENT DOCUMENTS

| | | |
|---|---|---|
| JP | 2002270743 A | 9/2002 |
| JP | 20010070889 | 9/2002 |
| JP | 2005252056 A | 9/2005 |
| WO | 2005055319 A2 | 6/2005 |

\* cited by examiner

Fig.5
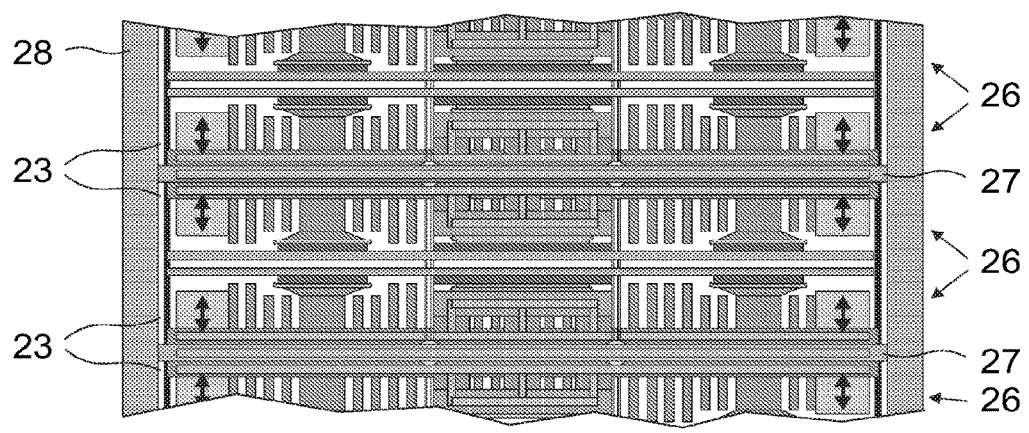
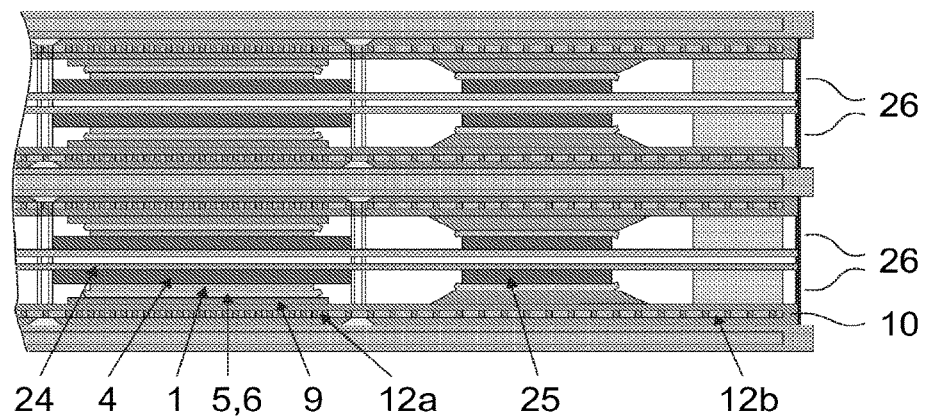
Fig.6

METHOD AND DEVICE FOR COOLING A HEAT GENERATING COMPONENT

DOMESTIC AND FOREIGN PRIORITY

This application is a Division of U.S. Non-Provisional application Ser. No. 12/676,398 filed Nov. 1, 2010 which claims priority to PCT/IB2008/053547 filed Sep. 2, 2008, which claims priority to European Application No. 07115962.8, and all the benefits accruing therefrom under 35 U.S.C. § 119. The contents of all applications are incorporated herein by reference in their entirety.

TECHNICAL FIELD

The present invention relates to a cooling arrangement, an integrated heat spreader and a method for cooling a heat generating component. More particularly, the invention relates to a cooling arrangement comprising a heat spreader comprising a first surface, a second surface, at least one heat absorption chamber and at least one heat dissipation chamber, the at least one heat absorption chamber being in thermal contact with the first surface and the at least one heat dissipation chamber being in thermal contact with the second surface and hydraulically coupled to the at least one heat absorption chamber.

BACKGROUND OF THE INVENTION

Cooling of heat generation components in general and semiconductor circuits in particular has been an important issue for many years. With continuous increases in transistor density and power consumption of microprocessors, the need for lower cost and more compact microprocessor cooling arrangements has become more desirable to further performance advancements. One problem, in particular in microprocessors, is that heat is generated in a limited physical space. Consequently, for effective cooling, the heat needs to be spread over a much larger area for more efficient cooling.

An example of cooling heat generating components is forced air convection. For example, many processors of current computer systems are cooled by a heat spreader, which distributes the heat generated by the processor over a larger surface which is then cooled by forced air convection using an electric fan.

Patent application US 2007/0017659 A1 discloses a heat spreader having a fluid sealed between two plates and a pumping mechanism to actuate a multi-phase flow of the fluid in a planar surface. Thermal energy from an electronic component in contact with the heat spreader is dissipated from a core region via the working fluid to the entire heat spreader and then to a heat sink. Surface enhancement features located between the two plates aid transfer of thermal energy from a first metal plate into the fluid.

Although improved heat flow from a heat generating component to a much larger surface is obtained with the aforementioned technique, a challenge exists to provide even better methods and devices for cooling a heat generating component. In particular, it is desirable that the cooling efficiency of a heat spreader is increased in order that the cooling of even more powerful heat generating components is possible. Conversely, the energy used by a cooling arrangement of a given heat generating component should be reduced in order to improve the overall energy efficiency. In addition, it is a challenge to provide methods and devices for cooling systems comprising a plurality or network of heat sources with variable loads.

SUMMARY OF THE INVENTION

According to an embodiment of one aspect of the present invention, a cooling arrangement is provided. The cooling arrangement comprises a heat spreader comprising a first surface, a second surface, at least one heat absorption chamber and at least one heat dissipation chamber, the at least one heat absorption chamber being in thermal contact with the first surface and the at least one heat dissipation chamber being in thermal contact with the second surface and hydraulically coupled to the at least one heat absorption chamber. The cooling arrangement further comprises at least one heat generating component arranged in thermal contact with the first surface of the heat spreader, a cooling fluid, filling at least part of the heat absorption chamber and the heat dissipation chamber, at least one actuator for driving the cooling fluid, and a controller for generating at least one control signal for the at least one actuator, such that the cooling fluid can be driven through the at least one heat absorption chamber using a plurality of flow patterns.

By providing a heat spreader having a heat absorption chamber and a heat dissipation chamber separate therefrom, the chambers being hydraulically coupled to one another, and at least one actuator for driving the cooling fluid, a controlled flow of the cooling fluid through the heat absorption chamber is generated. Having a separate heat absorption chamber and heat dissipation chamber reduces the volume of cooling fluid contained in the heat spreader, thus giving a possibility to avoid reduced pump to heat spreader volume ratios, and may prevent a reduction of the temperature of the fluid on its way to the heat dissipation chamber. Having these components separate also gives more flexibility in manufacturing and integration by implementing them with modular components.

According to an embodiment of the first aspect, the cooling fluid oscillates between the at least one heat absorption and the at least one heat dissipation chamber. By having the cooling fluid oscillate between the heat absorption chamber and the heat dissipation chamber, a controlled movement and exchange of the cooling fluid between the two chambers is implemented, thus transporting heat from the first surface to the second surface. In this case, it is preferable that the heat spreader comprises two heat dissipation chambers and at least two actuators, and the controller is adapted to drive the cooling fluid using two different flow patterns, wherein, in a first flow pattern, a flow from the first heat dissipation chamber through the at least one heat absorption chamber to the second heat dissipation chamber is created, and, in a second flow pattern, a flow from the second heat dissipation chamber through the at least one heat absorption chamber to the first heat dissipation chamber is created. In this way, the cooling fluid oscillates between the two heat dissipation chambers, transporting heat to either one in alternating turns, while the heat absorption chamber is cooled continuously.

Alternatively, the heat spreader preferably comprises four heat dissipation chambers and at least two actuators and the controller is adapted to drive the cooling fluid using four different flow patterns, wherein, in a first flow pattern, a flow from the first heat dissipation chamber through the at least one heat absorption chamber to the third heat dissipation chamber is created, in a second flow pattern, a flow from the second heat dissipation chamber through the at least one heat absorption chamber to the fourth heat dissipation chamber is created, in a third flow pattern, the flow from the third heat dissipation chamber through the at least one heat absorption chamber to the first heat dissipation chamber is created, and, in a fourth flow pattern, a flow from the fourth heat dissipation chamber through the at least one heat absorption chamber to the second heat dissipation chamber is created.

By using four heat dissipation chambers and four flow patterns, the cooling fluid is pumped through the heat absorption chamber in alternate turns from the first and third heat dissipation chamber and the second and fourth heat dissipation chamber, respectively. Consequently, while a constant flow through the heat absorption chamber is generated, part of the cooling fluid is always at rest in at least one heat dissipation chamber, where it dissipates its energy.

As a further alternative, the heat spreader preferably comprises a multiplicity of heat dissipation chambers, having a multiplicity of actuators arranged around the at least one heat absorption chamber in a substantially radial arrangement and the controller is adapted for driving the cooling fluid using a multiplicity of different flow patterns, creating a substantially radial oscillation of a flow of the cooling fluid through the at least one heat absorption chamber.

By creating a radial oscillation in the at least one heat absorption chamber, the center of the heat absorption chamber is always cooled by a constant flow of cooling fluid, while part of the cooling fluid stored in one of the multiplicity of heat dissipation chambers is at rest and dissipates the heat transferred from the heat absorption chamber.

According to a further embodiment of the first aspect, the heat spreader comprises a network of hydraulically interconnected chambers, comprising the at least one heat absorption chamber and at least two heat dissipation chambers, the network comprising multiple flow paths, each flow path connected to at least one actuator, and the controller is adapted to drive the cooling fluid using at least two different flow paths of the network using the plurality of flow patterns.

By arranging a number of hydraulically interconnected chambers in a network, such as an array, heat is transferred using multiple flows through the network between the chambers as desired for more efficient cooling. In particular, by using at least two different heat dissipation chambers, heat can be distributed to alternative heat dissipation chambers in alternating turns associated with the plurality of flow patterns.

According to a further embodiment of the first aspect, the at least one heat dissipation chamber comprises at least one membrane coupled to the at least one actuator for actuating the at least one membrane in order to drive the cooling fluid from or to the at least one heat dissipation chamber. By using a membrane coupled to an actuator, the at least one heat dissipation chamber acts as a pump for driving the cooling fluid to and from the heat dissipation chamber.

According to a further embodiment of the first aspect, the cooling arrangement comprises at least one first temperature sensor for sensing the temperature of the heat generating component, the at least one first temperature sensor is coupled to the controller, and the controller is adapted to generate the at least one control signal based on the sensed temperature of the heat generating component. By providing and using a first temperature sensor for providing feedback from the heat generating component to the controller, the cooling performance of the cooling arrangement can be adapted to the actual temperature of the heat generating component.

In this case, the cooling arrangement preferably further comprises at least one second temperature sensor for sensing the temperature of the at least one heat dissipation chamber, the at least one second temperature sensor is coupled to the controller, and the controller is adapted to generate the at least one control signal based on the sensed temperature of the at least one heat dissipation chamber. By providing and using a second temperature sensor for providing feedback from the heat dissipation chamber to the controller, the cooling performance of the cooling arrangement can be adapted to the actual temperature difference between the heat generating component and the heat dissipation chamber.

According to a further embodiment of the first aspect, the heat generating component comprises a plurality of areas and associated temperature sensors, the plurality of temperature sensors are coupled to the controller, and the controller is adapted to identify at least one hot spot corresponding to at least one area of the plurality of areas, the at least one hot spot being characterized in that is has a temperature above an average temperature of the plurality of areas, and the controller is further adapted to generate the at least one control signal based on the at least one identified hot spot, such that a flow of cooling fluid is directed to the at least one hot spot in at least one flow pattern.

By using a multiplicity of temperature sensors for identifying hot spots, a spatial distribution of heat generated by the heat generating component can be considered by the controller, such that a flow pattern directed to a hot spot is created by the controller.

According to a further embodiment of the first aspect, the heat spreader comprises a plurality of regions and associated temperature sensors, the plurality of temperature sensors are coupled to the controller, and the controller is adapted to identify at least one cold region of the heat spreader, the at least one cold region being characterized in that it has a temperature below an average temperature of the plurality of regions, and the controller is further adapted to generate at least one control signal based on the at least one identified cold region, such that the flow of cooling fluid is sourced from the at least one cold region in at least one flow pattern.

By using a multiplicity of temperature sensors for identifying cold regions of the heat spreader, a spatial distribution of heat dissipation of the heat spreader can be considered by the controller, such that a flow pattern sourced from a cold region is created by the controller.

According to a further embodiment of the first aspect, the heat spreader comprises at least two physically separated flow paths for the cooling fluid and, in a first flow pattern, cooling fluid is driven through the heat absorption chamber using the first flow path and, in a second flow pattern, cooling fluid is driven through the heat absorption chamber using the second flow path.

By using physically separate cooling paths for the cooling fluid, associated with different flow patterns, cooling fluid used in a particular flow pattern does not mix with cooling fluid of a separate flow pattern, improving heat distribution in networks of interconnected heat dissipation and heat absorption chambers.

According to an embodiment of a second aspect of the present invention, an integrated heat spreader is provided. The integrated heat spreader comprises at least one heat absorption chamber having a first surface for interfacing with a heat generating component and at least one heat dissipation chamber having a second surface for interfacing with an external coolant, the second surface being larger than the first surface. The integrated heat spreader further comprises a cooling fluid filling, at least partially, the at least one heat absorption chamber and the at least one heat dissipation chamber, at least one fluid interconnection between the at least one heat absorption chamber and the at least one heat dissipation chamber, and at least one pump element for creating a plurality of flow patterns between the at least one heat absorption chamber and the at least one heat dissipation chamber using a forced movement of the cooling fluid.

By providing an integrated heat spreader comprising at least one heat absorption chamber, at least one heat dissipation chamber, a cooling fluid, at least one fluid interconnection and at least one pump element for creating different flow patterns between the chambers, a self-contained cooling system for a heat generating component is created.

According to a further embodiment of the second aspect, at least one pump element comprises at least one membrane arranged in the at least one heat dissipation chamber. By providing a membrane in the at least one heat dissipation chamber, a pump mechanism internal to the integrated heat spreader is implemented.

According to a further embodiment of the second aspect, the at least one heat absorption chamber or heat dissipation chamber comprises at least one chamber wall having a surface enhancement feature for an increased heat exchange between the chamber wall and the cooling fluid. A chamber wall having a surface enhancement feature, such as a mesh structure, for example, increases the thermal flow through the heat spreader.

According to a further embodiment of the second aspect, the heat absorption chamber comprises at least two physically separated flow paths for the cooling fluid. By providing at least two physically separated flow paths in the at least one absorption chamber, unintended mixing of cooling fluid of different flow patterns may be reduced.

According to a further embodiment of the second aspect, the heat absorption chamber comprises at least four ports for at least four fluid interconnections, each port hydraulically connected to one further port of the at least four ports of the heat absorption chamber. By connecting each port of a multi-port heat absorption chamber with only one other port, a plurality of physically separated flow paths through the heat absorption chamber is provided.

According to an embodiment of a third aspect of the present invention, a method for cooling a heat generating component being in thermal contact with a first surface of a heat spreader having a plurality of chambers comprising a cooling fluid is provided. The method comprises the steps of:

determining an average temperature of the first surface or of the heat generating component, determining the position of at least one hot spot of the heat generating component, the at least one hot spot having a temperature above the determined average temperature, mapping the determined position of the at least one hot spot to a location on the first surface of the heat spreader, generating at least one first control signal for generating a first flow pattern of the cooling fluid through the plurality of chambers passing the mapped location, and generating at least one second control signal in alternating turns with the at least first control signal for generating a second flow pattern of the cooling fluid through the plurality of chambers, returning the cooling fluid back to its initial location.

By performing the method steps in accordance with the third aspect, an efficient cooling of a hot spot of a heat generating component may be achieved.

According to a further embodiment of the third aspect, in the second flow pattern the cooling fluid passes the mapped location of the hot spot in alternating turns with the first flow pattern. By also passing the location mapped to the at least one hot spot in the second flow pattern, a continuous cooling of the hot spot may be achieved.

According to a further embodiment of the third aspect, the method further comprises determining at least one chamber of the plurality of chambers having a temperature below the determined average temperature, wherein, in the step of generating the at least one first control signal, the first flow pattern of the cooling fluid is sourced from the at least one chamber determined to have an below average temperature. By sourcing the first flow pattern from a chamber having a below average temperature, the heat source is cooled to the lowest possible temperature.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

Figure 1:
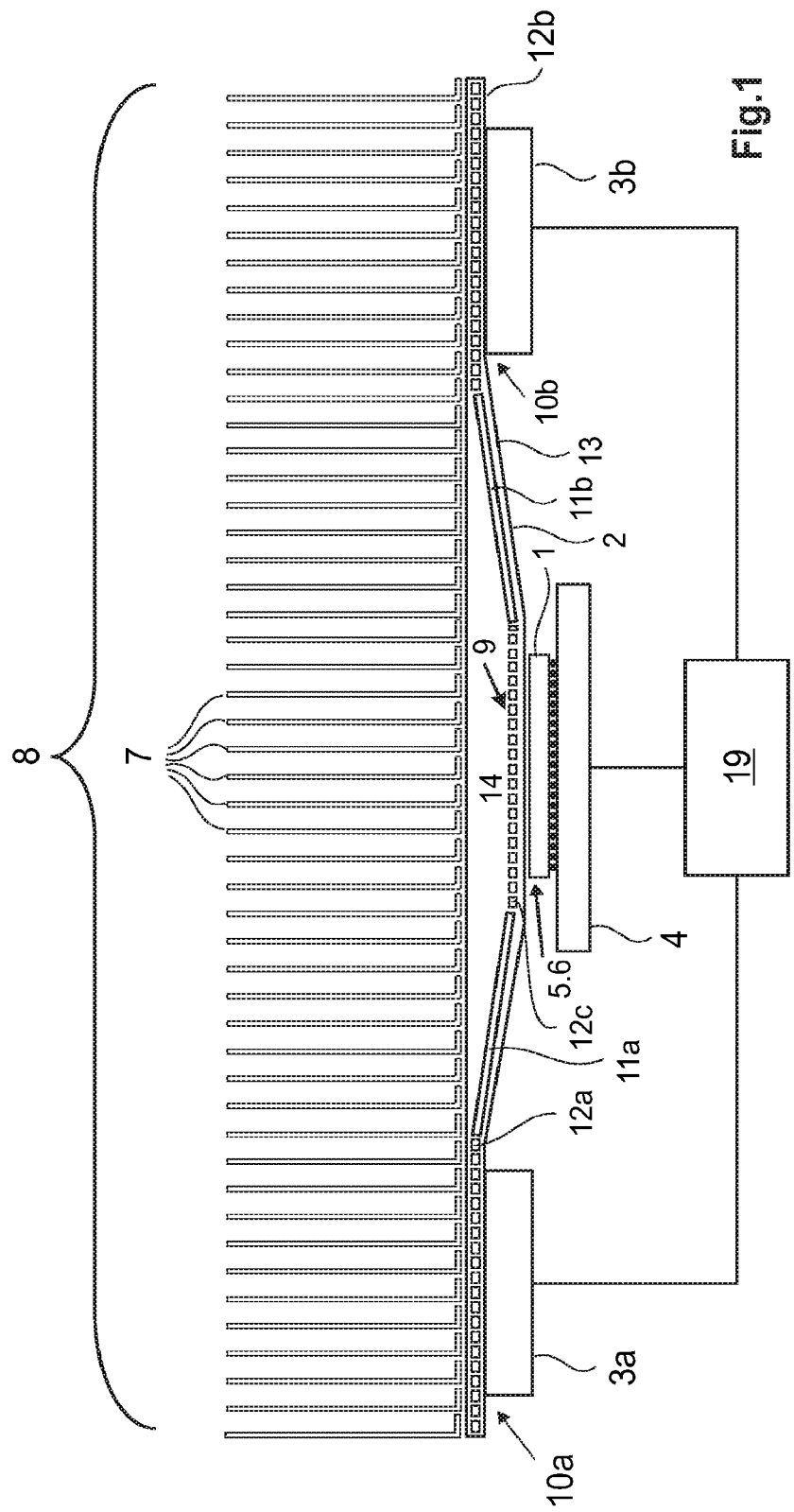
FIG. 1, a cross-section through a cooling arrangement according to an embodiment of the present invention, FIG. 2, a cross-section through an integrated heat spreader from above according to an embodiment of the present invention, FIG. 3A to FIG. 3D, different flow patterns through a heat absorption chamber according to different embodiments of the present invention, FIG. 4, a blade module comprising several heat generating components and a cooling arrangement according to an embodiment of the present invention, FIG. 5, a cross-section through a blade system comprising multiple blades, FIG. 6, a cross-section through a blade system comprising multiple thin form factor blades, FIG. 7, a thermal network comprising multiple heat generating components, FIG. 8, a heat dissipation chamber having two separate flow paths according to an embodiment of the invention, FIG. 9, a heat dissipation chamber having four separate flow paths according to an embodiment of the invention, and FIG. 10, a cooling arrangement using the heat dissipation chamber of FIG. 8 according to an embodiment of the invention.

In the drawings, the common reference signs are used to refer to like elements in different embodiments. In addition, added postfixes in the form of characters are used to distinguish individual elements of a group of similar elements. In cases where no such distinction is made in the corresponding description, any element of that group may be referred to.

DETAILED DESCRIPTION OF THE DRAWINGS

FIG. 1 shows a cross-section through a cooling arrangement comprising a processor 1, a heat spreader 2 and two actuators 3a and 3b. The actuators 3 are connected to and driven by a controller 19, which may be an integral part of the heat cooling arrangement or the processor 1, or separate therefrom. The processor 1 is mounted in a socket 4, which also comprises electrical contacts for providing the processor 1 with electrical energy and data. Typically, the processor 1 will comprise a large number of contacts, for example hundreds of contacts arranged in a so-called ball grid array (BGA). Processor 1 may also be mounted directly or indirectly on a printed circuit board (PCB) by any other known technology.

The processor 1 has a top surface 5, which is used to dissipate energy created by the transistors and other circuitry comprised in the processor 1. The top surface 5 of the processor 1 is in direct physical and thermal contact with a first surface 6 of the heat spreader 2. The top surface 5 and the first surface 6 roughly match in size and may have an area of roughly 1 cm.sup.2, for example. The heat spreader 2 also comprises a multiplicity of air fins 7, which together provide a second surface 8. The second surface 8 is much larger than the first surface 6. For example, the second surface 8 may comprise an area of roughly 1000 cm.sup.2 with the heat spreader footprint being approximately 100 cm.sup.2. The second surface 8 may be cooled by a cooling fan not shown in FIG. 1.

In order to allow fast and efficient heat transfer from the first surface 6 to the second surface 8, the heat spreader 2 comprises a heat absorption chamber 9 and two heat dissipation chambers 10a and 10b. The heat absorption chamber 9 and the heat dissipation chambers 10a and 10b are hydraulically connected by fluid interconnections 11a and 11b. Actuator 3a and actuator 3b can generate a flow from the heat dissipation chamber 10a through the heat absorption chamber 9 to the heat dissipation chamber 10b, for example. As can be seen in FIG. 1, the heat absorption chamber 9 is preferably located in physical proximity to the heat generating component, the processor 1 in this case, in order to reduce the thermal resistance there between. In the presented example, the heat absorption chamber 9 is separated from the top surface 5 of the processor 1 by a relatively thin chamber wall.

In one example, the actuator 3a will create an overpressure while actuator 3b will create a low-pressure in a cooling fluid 13, filling at least in part the heat absorption chamber 9 and the heat dissipation chambers 10, resulting in a flow from left to right in the cooling arrangement depicted in FIG. 1. In a subsequent time period, the actuator 3b may create an overpressure while the actuator 3a creates a low-pressure such that the cooling fluid 13 flows back from the heat dissipation chamber 10b through the heat absorption chamber 9 to the heat dissipation chamber 10a. By moving the cooling fluid 13 from one heat dissipation chamber 10a to the other heat dissipation chamber 10b, heat can be transferred with desirable effect from the first surface 6 to the second surface 8.

Although FIG. 1 depicts a cooling arrangement comprising two heat dissipation chambers 10a and 10b, alternatively a single heat dissipation chamber 10 connected to the heat absorption chamber 9 may be used. For example, a membrane may separate hot and cold cooling fluid 13 within a single heat dissipation chamber 10 pumped from and to the heat absorption chamber 9 using two fluid interconnections 11a and 11b simultaneously. Furthermore, instead of using two actuators 3a and 3b, a single actuator 3 and one or more vents may be used to create two or more different flow patterns through the heat absorption chamber 9.

In the arrangement presented in FIG. 1, both the heat absorption chamber 9 and the heat dissipation chambers 10a and 10b comprise a mesh structure 12 which increases the internal surface of the chambers and increases the fluid structure interaction. In consequence, a heat transfer from the solid part of the heat spreader 2, in particular the first surface 6, to the cooling fluid 13 and from the cooling fluid 13 to the second surface 8 is greatly increased. The mesh structure 12 may be adapted to the shape and characteristics of each chamber. For example, a high density mesh structure 12 may be employed in a relatively small heat absorption chamber 9, while a lower density mesh structure 12 may be employed in a larger heat dissipation chamber 10.

In addition, a solid part 14 of the heat spreader 2 helps to spread further heat from the first surface 6 to the second surface 8. In particular in cases where the flow of the cooling fluid 13 is blocked or reduced, a cooling of the processor 1 can be achieved by heat conduction from the first surface 6 to the air fins 7 arranged in a central area of the heat spreader 2.

Figure 2:
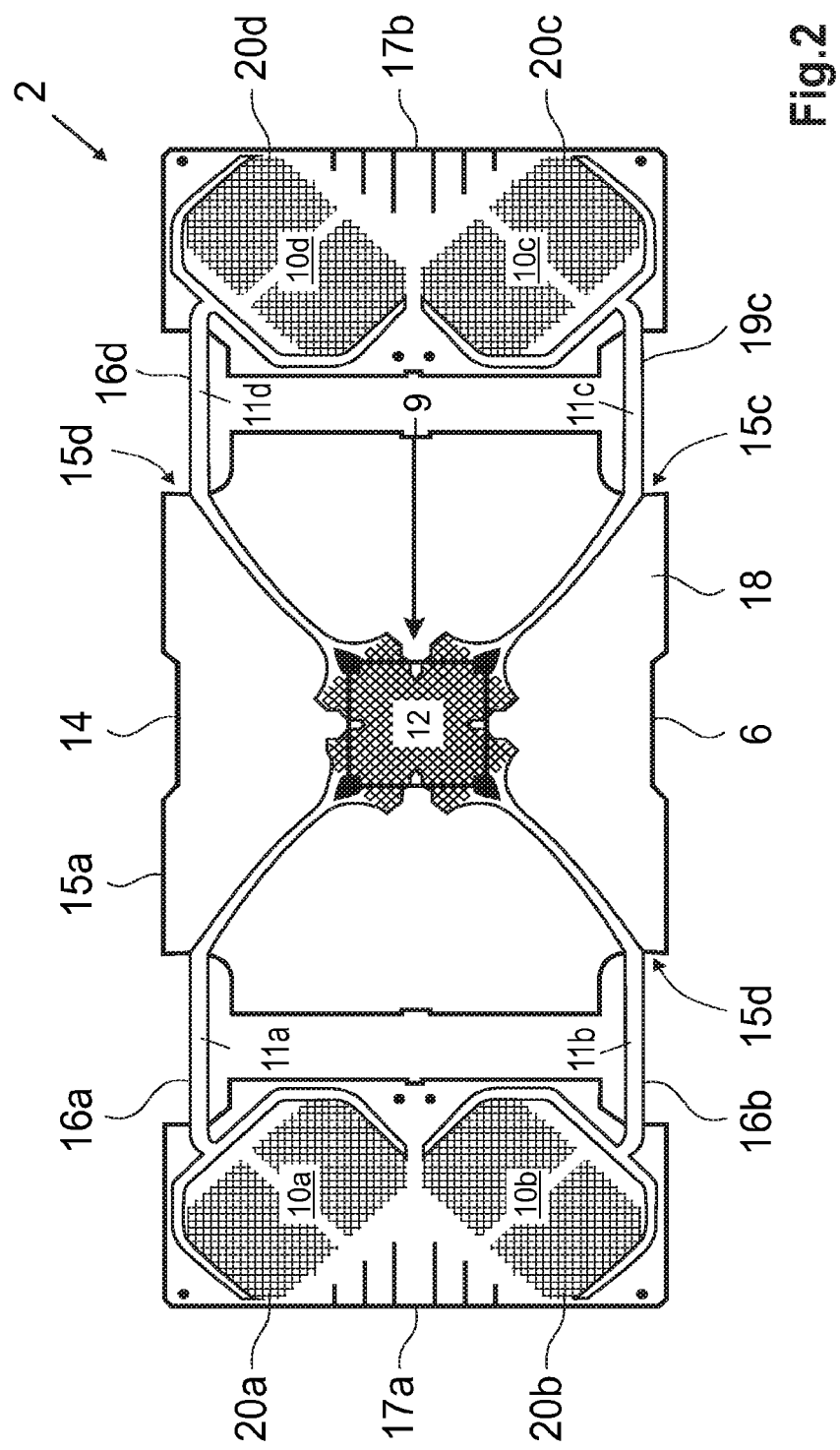

FIG. 2 shows a cross-section through an integrated heat spreader 2 from above. The heat spreader 2 comprises one heat absorption chamber 9 in the center and four heat dissipation chambers 10a to 10d. The heat absorption chamber 9 is connected to the four heat dissipation chambers 10a to 10d by means of fluid interconnections 11a to 11d. Each fluid interconnection 11 comprises an integrated channel structure 15 and a tube section 16. The channel structures 15a to 15d may be etched or stamped into the solid part 14 of the heat spreader 2. The tube section 16 may be bonded to the solid part 14 and the heat dissipation chambers 10a to 10d.

The different parts of the heat spreader 2 may be comprised in a single plate as shown in FIG. 1 or in three separate plates, two upper plates 17a and 17b for heat dissipation and a lower plate 18 for heat absorption as shown in FIG. 2. That is, the heat spreader 2 may be a single, integrated physical assembly or a system comprising two or more physically separate but interconnected units.

The fluid interconnections 11a to 11d between the heat absorption chamber 9 of the lower plate 18 and the four heat dissipation chambers 10a to 10d of the upper plates 17a and 17b may achieve an effective heat conductivity which is forty times greater than that of solid copper, creating a thermal short circuit between the first surface 6, which is in contact with the top surface 5 of a processor 1 or any other heat generating component, and the second surface 8, for example, fins 7 attached to the upper plates 17a and 17b cooled by forced air convection. In addition, by way of the fluid interconnections 11, a lower resistance transport of heat to the outermost regions of the heat spreader 2, i.e. away from the heat generating component, may be obtained.

In order to facilitate improved heat transfer from the first surface 6 to a cooling fluid 13, a mesh structure 12 may be etched, plated, molded or stamped into the heat absorption chamber 9. Equally, mesh structures 12 may be formed in each one of the heat dissipation chambers 10a to 10d. The mesh structure 12 integrated into the heat absorption chamber 9 may physically connect two opposing walls of that chamber, thus creating an additional heat conduction path from the first surface 6 to the air fins 7. Such and similar mesh structures 12, also referred to as surface enhancement features, are described in further detail in US 2007/0017659 A1, which is incorporated herein by reference.

In the example presented in FIG. 2, each of the heat dissipation chambers 10a to 10d comprises a membrane 20 which is connected to an internal or external actuator 3 by means of a piston like element. By moving the membrane 20 within a heat dissipation chamber 10 up or down, an over- or low-pressure can be created in that heat dissipation chamber. If, for example, an overpressure is created in the heat dissipation chamber 10a and an low-pressure is created in the heat dissipation chamber 10c, the flow of cooling fluid 13 from the heat dissipation chamber 10a through the fluid interconnection 11a, the heat absorption chamber 9 and the fluid interconnection 11c to the heat dissipation chamber 10c is created. Alternatively, the membranes 20 or other pumping elements may also be located in a separate component from the heat dissipation chambers 10.

Assuming that the cooling fluid 13 present at the heat dissipation chamber 10a is relatively cool, in particular has a temperature below a temperature of the cooling fluid 13 in other regions of the heat spreader 2, a first flow of cooling fluid 13 is created which arrives at first surface 6 very rapidly, i.e. using only moderate pump displacement and thus power, and without heating up significantly on its way. The use of moderate pump displacement is achieved due to the low surface to volume ratio of interconnect 11a, which is not meshed, in contrast with the heat exchanging regions 10a and 9 with a low surface to volume ratio interconnect 11a. Additionally, the cooling fluid 13, which will be heated up in the heat absorption chamber 9 to a relatively high temperature, is transported very effectively to the heat dissipation chamber 10c without a substantial temperature drop along the narrow fluid interconnection 11c. Because of the large differences in temperature between the heat absorption chamber 9 and the relatively cool cooling fluid 13 and, inversely, between the relatively warm cooling fluid 13 and the heat dissipation chamber 10c, heat is transported away from the first surface 6 very rapidly and effectively.

In the example described above, the heated up cooling fluid 13 may remain at the heat dissipation chamber 10c temporarily, while a second flow is created from the heat dissipation chamber 10b to the heat dissipation chamber 10d, for example. Using multiple flow patterns has the advantage that, while part of the cooling fluid 13 may rest in one heat dissipation chamber, like heat dissipation chamber 10c for example, an uninterrupted flow of cooling fluid 13 through the heat absorption chamber 9 can be maintained, thus constantly cooling the first surface 6 of the heat spreader 2.

The designs of the heat spreaders 2 presented in FIG. 1 and FIG. 2 comprise a relatively large solid part 14 and relatively narrow fluid interconnections 11. In particular, the solid part 14 occupies a larger area of the presented cross-section of the lower plate 18 than the fluid interconnections 11. This has the added advantage that even if the flow of cooling fluid 13 is blocked, for example because one or several of the actuators 3 is deactivated or fails, because a part of the cooling fluid 13 has escaped from the integrated heat spreader 2 or because one of the fluid interconnections 11 is blocked, heat dissipation from the first surface 6 may still take place by means of heat conduction within the solid part 14. Thus, while the overall effectiveness of the heat spreader 2 will be greatly reduced in such cases, limited cooling is still provided for a heat generating component arranged on the first surface 6.

So far, heat dissipation from a heat source spread over a relatively large first surface 6 of the heat absorption chamber 9 was described. However, in practice, many heat generating devices have a non-uniform heat distribution along their top surface 5. For example, a processor 1 comprises an arithmetic logical unit or processor core and a relatively large cache memory, occupying a larger area than the processor core. The processor 1 will generate considerably more heat in the area corresponding to the processor core than in the area corresponding to the cache memory. In contrast, the cache memory will occupy most of the area of the top surface 5 to be cooled. In consequence, a heat generating component may comprise one or several so-called "hot spots", whose temperature is above the average temperature of the heat generating component. For example, an arithmetic mean of several temperatures measured in different areas of the top surface 5 may be determined. An area having a temperature which lies above the determined arithmetic mean by a predefined absolute or relative amount, for example 5 degrees centigrade or a determined standard deviation of the measure temperatures, is identified as a hot spot. Alternatively, one or several maximum values of a temperature distribution may be determined.

Figure 3:
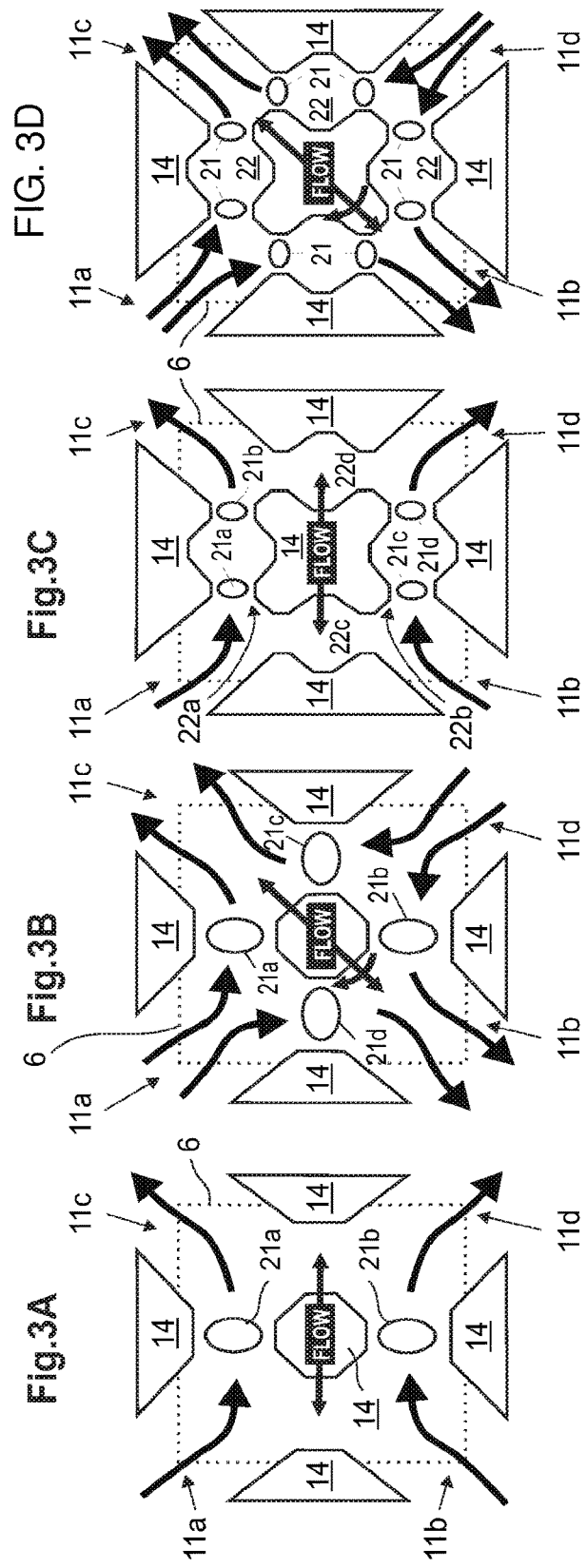

FIG. 3A to FIG. 3D show different flow patterns through a heat absorption chamber 9 which may be used to create effective cooling flows for a number of hot spots. In particular, FIG. 3A shows a heat absorption chamber 9 arranged in the area of a first surface 6. The first surface 6 may correspond, for example, to the die size of a semiconductor chip mounted on the first to surface 6. Fluid interconnections 11a to 11d serve as inlets and outlets to the heat absorption chamber 9 and are coupled to actuators 3a to 3d respectively, although this is not shown in FIG. 3A to FIG. 3D. In addition, solid parts 14 separate different flow paths within the heat absorption chamber 9 and also act as heat conductor and surface enhancement features.

In the example shown in FIG. 3A a first flow pattern from fluid interconnections 11a and 11b, acting as fluid inlets, to fluid interconnections 11c to 11d, acting as fluid outlet, is created. A second flow pattern, which is not shown in FIG. 3A, is the inverse of the fluid pattern presented, i.e. the fluid interconnection 11c and 11d serve as fluid inlets and the fluid interconnections 11a and 11b serve as fluid outlets. Thus, effectively an oscillating flow pattern flowing from left to right in a first phase and from right to left in a second phase through the heat absorption chamber 9 is created.

On the first surface 6, two hot spots 21a and 21b are present. Due to the central solid part 14 and the pressure distribution profile within the cooling fluid 13 in the heat absorption chamber 9, a relatively fast first flow of cooling fluid 13 across the hot spots 21a and 21b is created. The first flow has a flow velocity which is above the average flow velocity of the cooling fluid 13 within the heat absorption chamber 9. Relatively cool areas, arranged, for example, between the left, central and right solid parts 14, receive a second flow of cooling fluid having a lower flow velocity than the first flow and are not cooled as efficiently by the flow patterns described. In contrast, a much higher pump power would have to be implemented for cooling all areas of the first surface 6 equally, resulting in a less effective overall cooling system.

FIG. 3B shows a different configuration of a first surface 6 having four hot spots 21a to 21d. Here, a different flow pattern is used to cool the hot spots 21. In the flow pattern example presented, two opposing fluid interconnections 11a and 11d act as fluid inlet, while the remaining fluid interconnections 11b and 11c serve as fluid outlets. In the example presented, the flows of cooling fluid 13 are bifurcated by the central solid part 14 and, in consequence, flows of the cooling fluid 13 across all hot spots 21a to 21d are created in a first phase. In a second phase, the direction of the flows indicated in FIG. 3B is reversed, such that fluid inlets 11a and 11d serve as fluid outlets and fluid interconnections 11b and 11c serve as fluid inlets. As further indicated in FIG. 3B, the axis of the oscillation may be altered with time, resulting in a rotating and oscillating flow pattern. For example, the axis of oscillation may change from a first diagonal direction via a horizontal direction and a second diagonal direction to a vertical direction and so on.

FIG. 3C shows a further configuration of a first surface 6 having four hot spots 21a to 21d. In this configuration, the solid part 14 arranged in the central area of the heat absorption chamber 9 creates internal channels 22a to 22d. In the configuration shown, the a first internal channel 22a guides cooling fluid 13 across two hot spots 21a and 21b while a second internal channel 22b guides cooling fluid 13 across the hot spots 21c and 21d.

In a first flow pattern, which is similar to the flow pattern presented in FIG. 3A, cooling fluid 13 is pumped from the left to the right. In a second flow pattern, the flow of the cooling fluid 13 is reversed, i.e. a flow from the right to the left is created. Thus, in the first phase, the hot spots 21a and 21c are cooled more efficiently, as they are closest to the fluid inlet. The hot spots 21b and 21d are cooled less efficiently, because by the time the cooling fluid 13 arrives at their location, it has already been pre-heated by the hot spots 21a and 21c, reducing its capacity to further absorb heat. In the second phase, inversely, the hot spots 21b and 21d are cooled more efficiently, as they are closest to the fluid inlets.

FIG. 3D shows a further configuration of a heat absorption chamber 9 with the first surface 6 comprising eight hot spots 21. In the configuration shown in FIG. 3D, two hot spots 21 are present in each one of the internal channels 22. In addition, the internal channels 22 are narrower in places of the hot spots 21 than in other places, resulting in an accelerated flow across the hot spots 21. The flow pattern used to cool all of the hot spots 21 are similar to the ones described with reference to FIG. 3B.

Instead of forming discrete internal channels 22 as shown in FIG. 3C and FIG. 3D, a density of a mesh structure 12 may be increased in areas close to a hot spot 21 and reduced in cooler areas of the first surface. In this way the flow rate of the cooling fluid 13 may be adapted to varying cooling requirements of a heat generating component.

The physical arrangement of the heat absorption chamber 9 and the fluid interconnections 11 of FIG. 3A and FIG. 3B and those shown in FIGS. 3C and 3D are identical. This means that a controller 19 connected to a cooling arrangement may switch from one flow pattern, for example a linear flow pattern, to another, for example a radial flow pattern, by adapting one or several control signals provided to actuators 3. More particularly, the situations depicted in FIG. 3A and FIG. 3B, or FIG. 3C and FIG. 3D may be used for operating the same heat generating components in different operating modes. For example, a processor 1 having multiple processor cores may not use all processor cores at all times, resulting in different heat distributions at its top surface 5.

A method for operating the cooling arrangement may be used to compute control signals for the actuators 3 that create different flows of cooling fluid 13 within the heat spreader 2. Such a method can be used to adapt the configuration of the cooling arrangement on demand. The method may be implemented in hard- or software or a combination thereof, e.g. a purpose designed controller 19 or a universal processor 1 executing a computer code loaded from some storage medium, like a RAM, ROM or magnetic storage medium.

According to an advanced embodiment, one or several heat sensors are comprised in the heat generating components, for example on or close to a die of a processor 1, which sense the temperature of the first surface 6. This information may be provided to the controller 19 providing signals to the actuators 3, thus controlling the flow patterns through the heat absorption chamber 9. If, for example, a controller 19 identifies that the hot spot 21a shown in the configuration presented in FIG. 3A is considerably hotter than the hot spot 21b in the lower part, a relatively higher pump drive signal may be provided to the actuators 3a and 3c compared with the pump drive signal provided to the actuators 3b and 3d, thus adapting the overall flow patterns used to the current requirements.

Alternatively, or in addition, temperature sensors may also be provided on or in the heat spreader 2, the heat absorption chamber 9 or the heat dissipation chamber 10. Temperature information provided to the controller 19 may be used to identify cooler regions of the heat spreader 2, which may be used as a source of cooling fluid 13 for cooling hot spots 21. In this way, the controller may determine an optimal configuration automatically, for example by determining the side of the heat spreader from which cool air or liquid for secondary cooling is provided.

Figure 4:
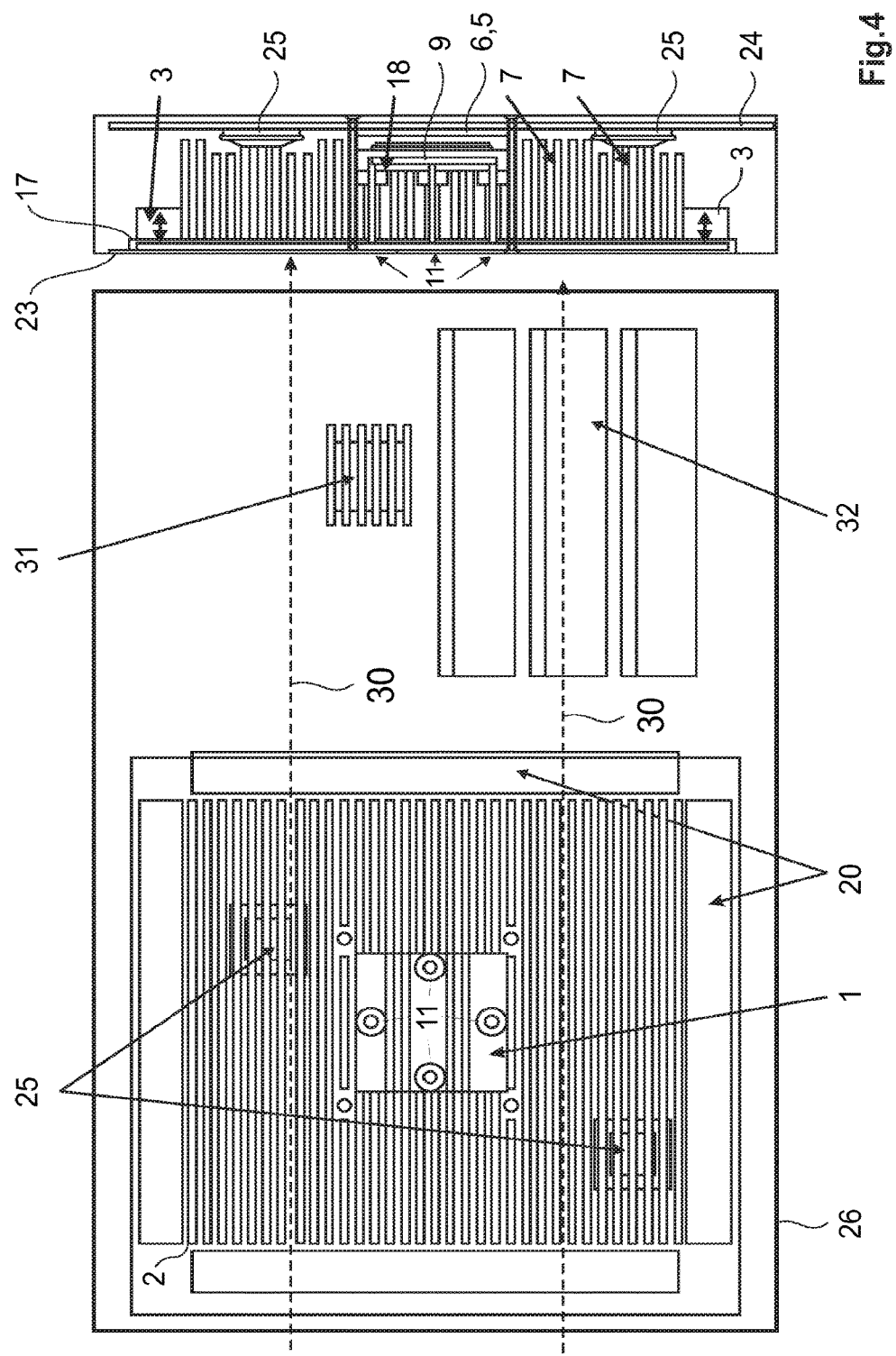

FIG. 4 shows a top view and a cross-section of a so-called blade 26, which is a printed circuit computer board having a particularly thin form factor of roughly 30 mm height. FIG. 4 shows a possible configuration of a heat spreader 2 which is particularly suited for cooling heat generating components of the blade 26. In this configuration, an upper plate 17 comprising a heat dissipation chamber 10 is arranged on a cooling plate 23 opposite to a printed circuit board 24 carrying one or several heat generating components. The cooling plate 23 serves as a heat dissipation area for the arrangement shown in FIG. 4, i.e. during operation of the blade 26, heat is transferred from the heat generating components to the cooling plate 23, the heat generating components having a higher temperature than the cooling plate 23. The upper plate 17 extends over a large area with respect to the dimension of the printed circuit board 24 and has a vertical clearance over the highest surface of components mounted on the printed circuit board 24.

In the example presented in FIG. 4, only a central processor 1 arranged in the center of the heat spreader 2 is in thermal contact with a first surface 6 in an area of a heat absorption chamber 9 of the heat spreader 2. The heat absorption chamber 9 is thermally coupled to the cooling plate 23 using a four fluid interconnects 11. In addition, secondary heat sources 25, such as logic chips, are in thermal contact with air fins 7 made from a heat conductive material, for example copper, which couple the secondary heat sources 25 to the upper plate 17.

Membranes 20 and actuators 3 are arranged on the periphery of the cooling plate 23 and can create an oscillating and optionally azimuthally rotating flow pattern within the upper plate 17. In addition, the fluid interconnections 11 create channels between the upper plate 17 and the lower plate 18 comprising the heat absorption chamber 9 in the area of the processor 1. In this way, hot spots present on a top surface 5 of the processor 1 can be cooled very effectively with a relatively fast flow of cooling fluid 13, while spreading the heat across the extent of the cooling plate 23 having a much larger cross sectional area results in a slower flow there.

In addition, cooling may be affected by different means or a combination thereof. In particular, the blade 26 shown in FIG. 4 may be cooled by an air flow 30 through the air fins 7. In the example presented, the air flow 30 is also used to cool a tertiary heat source 31 having a separate finned air cooler and memory modules 32. In addition or alternatively, cooling may be performed by heat conduction or radiation from the cooling plate 23, which may be arranged on a chassis part of a blade cage or a further heat exchanger, for example.

FIG. 5 shows a configuration of a computer system comprising several blades 26. As can be seen in FIG. 5, the cooling plates 23 of blades 26 are arranged top-to-top separated by a cold plate 27 of a blade cage 28. The cold plate 27 of the blade cage 28 comprises a secondary cooling circuit, for example a water cooling system. The cold plate 27 comprises a coolant having a temperature below the temperature of the cooling plate 23, which transports heat away from the cooling plates 23 of the heat spreader of the blades 26 to an external cooler. At the same time, there is no need for a fluid connection between the blade cage 28 and the blades 26, allowing straightforward insertion and removal of individual blades 26. In this way, a computer system comprising a large number of blades 26 can be built and cooled efficiently. Optionally the blades could be arranged bottom-to-top or with higher power dissipation components on both sides of the printed circuit board in order to increase integration density even further.

FIG. 6 shows another blade system comprising a plurality of so-called thin form factor blades 26. Thin form factor blades are less than 30 mm in height, such that an arrangement as shown in FIG. 5 may not be used for partial air cooling. Thus, according to FIG. 5, practically all the heat dissipated on the printed circuit board 24 is transferred by the cooling fluid 13 from the heat generating components to the cold plate 27 directly, i.e. not using a separate lower plate 18 or air fins 7. In order to optimize the heat flux from the processor 1, a high density mesh 12a is used in its area, acting as a heat absorption chamber 9, while a lower density mesh 12b is used in another area, acting as a heat dissipation chamber 10. The absorption chamber 9 and the dissipation chambers 10 are combined in one thermal spreader plane that distributes the heat load evenly so that it can effectively be transferred across the thermal interface between the spreader and the cold plate 27. With this arrangement, blade components and blade pitch can be vertically compressed to approximately 5 mm per printed circuit board with components and thermal spreader planes mounted on both sides.

Figure 7:
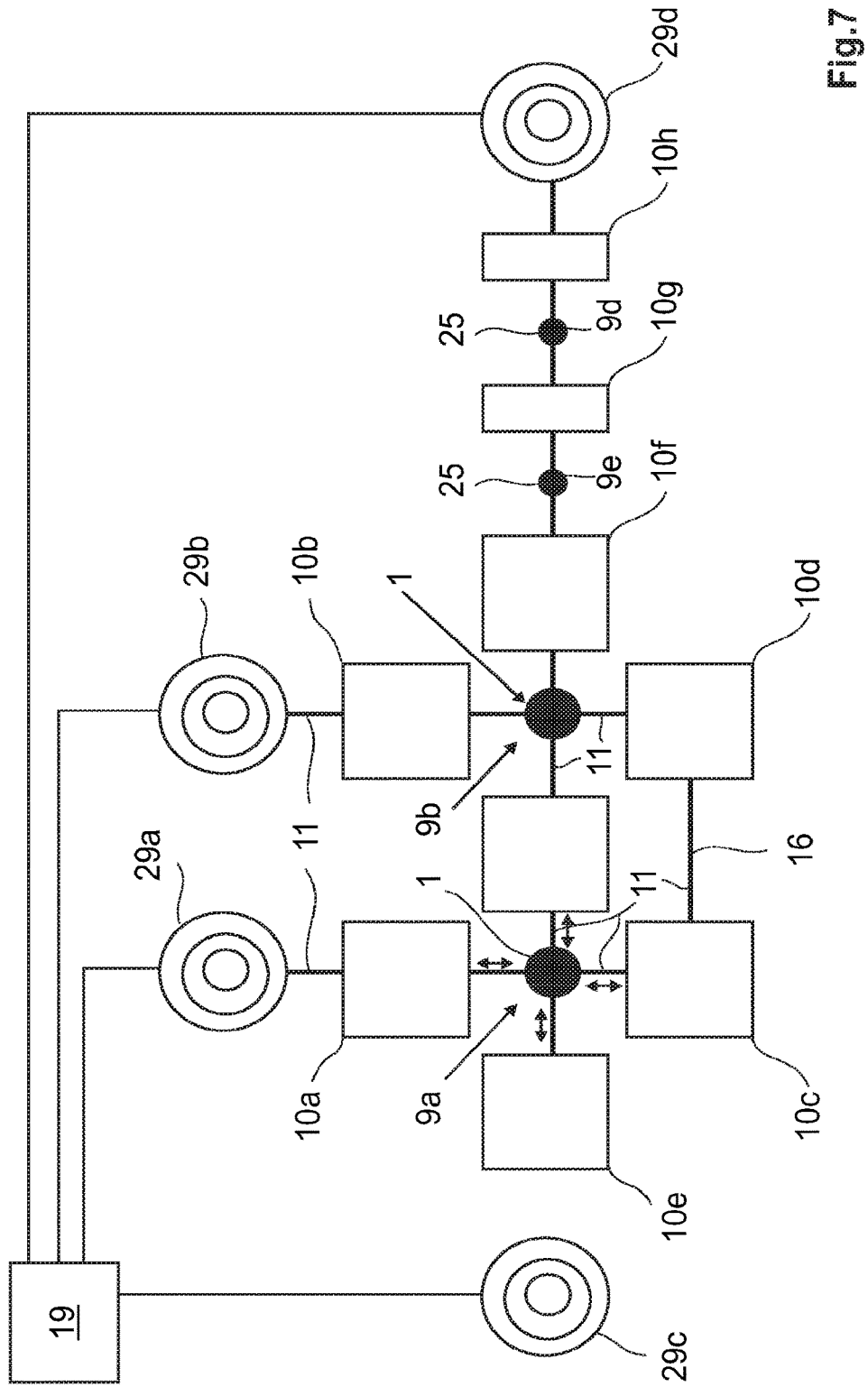

FIG. 7 shows a thermal network comprising multiple heat sources. In such an arrangement, multiple heat absorption chambers 9 and heat dissipation chambers 10 may be interconnected by a multiplicity of fluid interconnections 11. Multiple membrane pumps 29 are connected to the thermal network and allow creating a multiplicity of flow patterns through the network. In this way, an array-like structure of heat absorption chambers 9 and heat dissipation chambers 10 may be controlled effectively in order to spread the heat generated by a number of heat generating components such as processors 1 and secondary heat sources 25 over a relatively large area. The heat may be spread uniformly over the entire thermal network or, alternatively, directed to areas with increased cooling capabilities. For example, higher volumes of cooling fluid 13 may be pumped into a heat dissipating chamber 10 close to a cooling air inlet.

Depending on the actual layout of the array, separate membrane pumps 29 need not be implemented for each heat dissipation chamber 10. For example, a first column, comprising the membrane pump 29a, the heat dissipation chambers 10a and 10c and the heat absorption chamber 9a, and a second column, comprising the membrane pump 29b, the heat dissipation chambers 10b and 10d and the heat absorption chamber 9b, are operated together, sharing the two membrane pumps 29a and 29b. This is achieved by connecting the lower heat dissipation chambers 10c and 10d using a fluid interconnection 11, in particular a tube section 16. In this way, while cooling fluid 13 is pumped from the heat dissipation chamber 10a to the heat dissipation chamber 10c via a first heat absorption chamber 9a, cooling fluid 13 is also pumped from the heat dissipation chamber 10d to the heat dissipation chamber 10b via a second heat absorption chamber 9b.

At the same time, or alternating with this flow of cooling fluid 13, a further flow pattern corresponding to the row of the network may be generated by membrane pumps 29c and 29d. This will cool the two processors 1 and the two secondary heat sources 25 arranged in that row. The heat absorption chambers 9c and 9d may be configured differently than the heat absorption chambers 9a and 9b, in order to adapt them to the thermal requirements of the secondary heat sources 25. In the example presented, they are connected to two fluid interconnections 11, while each one of the heat absorption chambers 9a and 9b is connected to four fluid interconnections 11. In addition, the heat dissipation chambers 10g and 10h are smaller than the other heat dissipation chambers 10 shown in FIG. 7, due to the reduced heat generation of the secondary heat sources 25. In general, instead or additional to adapting the flow path used by the cooling fluid 13 in different flow patterns, the amount of cooling fluid 13 pumped through the heat absorption chambers 9 or heat dissipation chambers may be adapted in different flow patterns with a controller 19.

Figure 8:
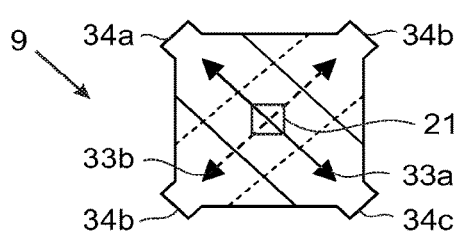

FIG. 8 shows an alternative design for a heat absorption chamber 9. In particular, the heat absorption chamber 9 according to FIG. 8 comprises two separate flow paths 33a and 33b, which are physically separated from each other, yet both in thermal contact with a hot spot 21 of the heat absorption chamber 9. The hot spot 21 may be arranged in a central area, where the flow paths 33a and 33b converge. The heat absorption chamber 9 comprises four fluid ports 34a to 34d, which serve as fluid inlet and fluid outlets to the first and second flow paths 33a and 33b, respectively.

By actuating the first flow along the first flow path 33a alternating with a second flow along the second flow path 33b, a radial distribution of heat from the hot spot 21 is achieved. That is, although the first and second flows are alternating, the hot spot 21 is cooled continuously.

Figure 9:
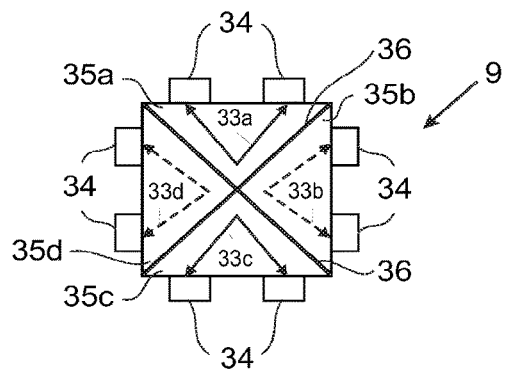

FIG. 9 shows a further embodiment of a heat absorption chamber 9 according to an embodiment of the invention. In particular, the heat absorption chamber 9 according to FIG. 9 comprises four separate areas 35a to 35d that are physically separated from one another by means of partitioning walls 36. Each area 35a to 35d comprises two fluid ports 34, which serve as an inlet and outlet to the particular area.

The embodiment of the heat absorption chamber 9 shown in FIG. 9 represents an eight-port radial absorber with four isolated flow paths 33. The flow paths 33 according to FIG. 9 are both radially and horizontally distributed. For example, a first and third flow along the flow paths 33a and 33c may be affected in a first flow pattern, whereas a second and a fourth flow of cooling fluid 13 may be affected in a second flow pattern along flow path 33b and 33d.

Alternative control signals may be used to implement more complicated flow patterns through the heat absorption chamber 9 shown in FIG. 9. For example, in a first four-phase flow pattern, each area 35a to 35d may be provided with cooling fluid 13 sequentially around the chamber in phases. In an alternative four-phase flow pattern, the first and third areas 35a and 35c of the heat absorption chamber 9 may be provided with a cooling fluid 13 in a first direction in a first phase, followed by the provision of the cooling fluid 13 to the second and the fourth area 35b and 35d in a second phase. In a third and fourth phase, the flow pattern of the first and the second phase are repeated with the inverse orientation of the flow of the cooling fluid 13.

Figure 10:
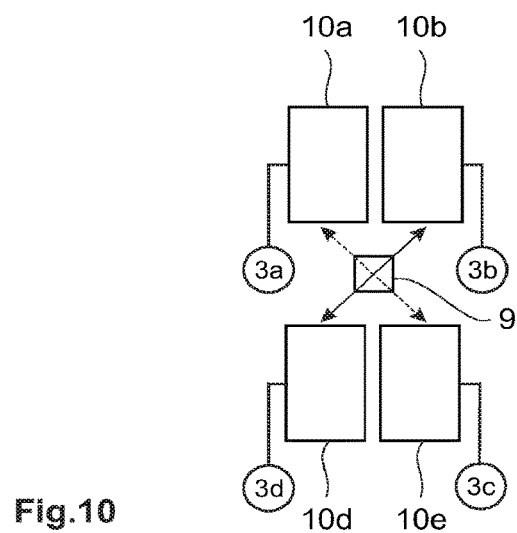

FIG. 10 shows a cooling arrangement using the heat absorption chamber 9 according to FIG. 8. The four fluid ports 34a to 34d of the heat absorption chamber 9 are connected to four heat dissipation chambers 10a to 10d.

Using actuators 3a to 3d connected with the heat dissipation chambers 10a to 10d, in effect a periodic radial spreading of heat from the heat absorption chamber 9 is implemented by driving the actuators 3a and 3c in alternating terms with the actuators 3b and 3d.

Although different aspects and features of cooling arrangements were described with reference to different embodiments above, a person skilled in the art may combine any feature disclosed herein with any other feature or combination thereof. In particular, flow patterns described with reference to a single heat absorption chamber 9 may also be used in a network or array interconnecting a plurality of heat absorption chambers 9 and vice versa.

In addition, although the cooling arrangements described above were described with reference to a single plane architecture for reasons of representational simplicity, the same or similar techniques may be applied to multi-level design, wherein several heat generating components are stacked on top of each other, separated by cooling plates comprising one or several heat absorption chambers 9.

The invention claimed is:

1. A cooling arrangement, comprising:
a heat spreader comprising a first surface, a second surface, at least one heat absorption chamber and at least one heat dissipation chamber, the at least one heat absorption chamber being in thermal contact with the first surface and the at least one heat dissipation chamber being in thermal contact with the second surface and hydraulically coupled to the at least one heat absorption chamber;
at least one heat generating component arranged in thermal contact with the first surface of the heat spreader;
a cooling fluid, filling at least part of the heat absorption chamber and the heat dissipation chamber;
at least one actuator for driving the cooling fluid; and
a controller for generating at least one control signal for the at least one actuator, such that the cooling fluid can be driven through the at least one heat absorption chamber using a plurality of flow patterns;
wherein the heat spreader comprises a plurality of regions and associated temperature sensors, the plurality of temperature sensors are coupled to the controller, and the controller programmed to identify at least one cold region of the heat spreader, the at least one cold region being characterized in that it has a temperature below an average temperature of the plurality of regions, and the controller is further programmed to generate at least one control signal based on the at least one identified cold region, such that the flow of cooling fluid is sourced from the at least one cold region in at least one flow pattern.

2. The cooling arrangement according to claim 1, wherein the cooling fluid oscillates between the at least one heat absorption chamber and the at least one heat dissipation chamber.

3. The cooling arrangement according to claim 2, wherein the at least one heat dissipation chamber comprises two heat dissipation chambers and the at least one actuator is at least two actuators, and the controller is adapted to drive the cooling fluid using two different flow patterns, wherein, in a first flow pattern, a flow from the first heat dissipation chamber through the at least one heat absorption chamber to the second heat dissipation chamber is created, and, in a second flow pattern, a flow from the second heat dissipation chamber through the at least one heat absorption chamber to the first heat dissipation chamber is created.

4. The cooling arrangement according to claim 2, wherein the at least one heat dissipation chamber comprises four heat dissipation chambers and the at least one actuator is at least two actuators and the controller is adapted to drive the cooling fluid using four different flow patterns, wherein, in a first flow pattern, a flow from the first heat dissipation chamber through the at least one heat absorption chamber to the third heat dissipation chamber is created, in a second flow pattern, a flow from the second heat dissipation chamber through the at least one heat absorption chamber to the fourth heat dissipation chamber.

5. The cooling arrangement according to claim 2, wherein the heat spreader comprises a multiplicity of heat dissipation chambers having a multiplicity of actuators arranged around the at least one heat absorption chamber in a substantially radial arrangement and the controller is adapted for driving the cooling fluid using a multiplicity of different flow patterns, creating a substantially radial oscillation of a flow of the cooling fluid through the at least one heat absorption chamber.

6. The cooling arrangement according to claim 1, wherein the heat spreader comprises a network of hydraulically interconnected chambers, comprising the at least one heat absorption chamber and at least two heat dissipation chambers, the network comprising multiple separate flow paths, each separate flow path connected to at least one actuator, and the controller is adapted to drive the cooling fluid using at least two different separate flow paths of the network using the plurality of flow patterns.

7. The cooling arrangement according to claim 1, wherein the at least one heat dissipation chamber comprises at least one membrane coupled to the at least one actuator for actuating the at least one membrane in order to drive to cooling fluid from or to the at least one heat dissipation chamber.

8. The cooling arrangement according to claim 1, wherein the cooling arrangement comprises at least one first temperature sensor for sensing the temperature of the heat generating component, the at least one first temperature sensor is coupled to the controller, and the controller is adapted to generate the at least one control signal based on the sensed temperature of the heat generating component.

9. The cooling arrangement according to claim 8, wherein the cooling arrangement further comprises at least one second temperature sensor for sensing the temperature of the at least one heat dissipation chamber, the at least one second temperature sensor is coupled to the controller, and the controller is adapted to generate the at least one control signal based on the sensed temperature of the at least one heat dissipation chamber.

10. The cooling arrangement according to claim 1, wherein the heat generating component comprises a plurality of areas and associated temperature sensors, the plurality of temperature sensors are coupled to the controller, and the controller is adapted to identify at least one hot spot corresponding to at least one area of the plurality of areas, the at least one hot spot being characterized in that it has a temperature above an average temperature of the plurality of areas, and the controller is further adapted to generate the at least one control signal based on the least one identified hot spot, such that the flow of cooling fluid is directed to the at least one hot spot in at least one flow pattern.

11. The cooling arrangement according to claim 1, wherein the heat spreader comprises at least two physically separated flow paths for the cooling fluid and, in a first flow pattern, cooling fluid is driven through the heat absorption chamber using the first flow path and, in a second flow pattern, cooling fluid is driven through the heat absorption chamber using the second flow path.

12. The cooling arrangement according to claim 1, wherein the heat absorption chamber is physically separated from the heat dissipation chamber.

\* \* \* \* \*